(12) United States Patent
Fu

(10) Patent No.: US 9,897,830 B2
(45) Date of Patent: Feb. 20, 2018

(54) DISPLAY PANEL INSPECTION SYSTEM AND INSPECTION METHOD FOR THE SAME

(71) Applicant: Shenzhen China Star Optoelectronics Technology Co., Ltd., Shenzhen, Guangdong (CN)

(72) Inventor: Yanfeng Fu, Guangdong (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 160 days.

(21) Appl. No.: 14/895,619

(22) PCT Filed: Sep. 16, 2015

(86) PCT No.: PCT/CN2015/089688
§ 371 (c)(1),
(2) Date: Dec. 3, 2015

(87) PCT Pub. No.: WO2017/000390
PCT Pub. Date: Jan. 5, 2017

(65) Prior Publication Data
US 2017/0219856 A1    Aug. 3, 2017

(30) Foreign Application Priority Data
Jul. 1, 2015 (CN) .......................... 2015 1 0377906

(51) Int. Cl.
*G01R 31/26* (2014.01)
*G02F 1/13* (2006.01)
(Continued)

(52) U.S. Cl.
CPC ....... *G02F 1/1309* (2013.01); *G01R 31/2825* (2013.01); *G09G 3/006* (2013.01); *G02F 1/1368* (2013.01); *G09G 2300/0426* (2013.01)

(58) Field of Classification Search
CPC .............. G01R 31/025; G01R 31/2621; G01R 31/2635; G01R 31/2825; G09G 3/006;
(Continued)

(56) References Cited

U.S. PATENT DOCUMENTS

| | | | |
|---|---|---|---|
| 2003/0035081 A1* | 2/2003 | Jung ................... | G02F 1/13458 349/152 |
| 2016/0306212 A1* | 10/2016 | Lim ..................... | G02F 1/1345 |
| 2017/0123249 A1* | 5/2017 | Yoshida ............... | G02F 1/1368 |

* cited by examiner

*Primary Examiner* — Minh N Tang
(74) *Attorney, Agent, or Firm* — Andrew C. Cheng

(57) ABSTRACT

A display panel inspection system and an inspection method for the same are provided. The system includes multiple electrode signal lines located in a display region, each has a starting terminal and an end terminal, multiple fan-out traces connected with the multiple electrode signal lines, multiple electrode signal input terminals connected with the multiple fan-out traces, multiple test pads connected with the multiple electrode signal input terminals, each has an end terminal, a signal transmitter and a signal receiver, wherein the signal transmitter transmits a signal at the starting terminal the electrode signal line, and the signal receiver receives a signal from the end terminal of the electrode signal line or the test pad. Accordingly, an open or short can be detected at the fan-out traces to decrease a light line ratio in the module process to increase the product yield rate.

7 Claims, 4 Drawing Sheets

(51) Int. Cl.
*G09G 3/00* (2006.01)
*G01R 31/28* (2006.01)
*G02F 1/1368* (2006.01)

(58) Field of Classification Search
CPC ...... G09G 3/36; G09G 3/3648; G09G 3/2092;
G02F 1/13; G02F 1/1309; G02F 1/1362;
G02F 1/1345; G02F 1/1333
See application file for complete search history.

DISPLAY PANEL INSPECTION SYSTEM AND INSPECTION METHOD FOR THE SAME

BACKGROUND OF THE INVENTION

1. Field of the Invention

The present invention relates to a liquid crystal display technology field, and more particularly to display panel inspection system and inspection method for the same.

2. Description of Related Art

In the conventional art, after finishing a gate electrode line, a source electrode line and a drain electrode line in a TFT LCD manufacturing process, a process for inspecting an open and short circuit defect of internal signal lines is executed in order to detect the open and short circuit defect of the gate line, the source and the drain line so that the gate line, the source and the drain line can be repaired right away in order to improve a production yield rate.

A conventional open or short test (OST) machine is limited for a line width, a line length, and a gap between two lines. As shown in FIG. 1, the conventional OST machine cannot transmit signals at signal input terminals 13' of a gate electrode line 11', a source electrode line 21', and a drain electrode line 21'. The conventional OST machine can only transmit a signal at a starting terminal of a display area, and receive a signal at an end terminal of the display area. Therefore, the conventional OST machine can only detect the open and short defect of the gate electrode line, the source electrode line, and the drain electrode line inside the display area, and cannot detect the open and short defect of fan-out traces 12', 22'.

However, a large-sized TFT LCD generally utilizes a bi-directional driving design, if the open and short defects of the fan-out traces or the signal lines in the display region cannot be completely detected, when bypassing to a next module process, a horizontal light line is generated in order to affect a production yield rate.

Therefore, for the above technology problems, a display panel detection system and a detection method are required.

SUMMARY OF THE INVENTION

In order to overcome the drawback of the conventional technology, the purpose of the present invention is to provide a display panel inspection system and an inspection method for the same.

In order to achieve the above purpose, a technology solution adopted by an embodiment of the present invention is: a display panel inspection system, comprising: multiple electrode signal lines located in a display region of a display panel, each electrode signal line has a starting terminal and an end terminal; multiple fan-out traces connected with the multiple electrode signal lines and fanned out outwardly; multiple electrode signal input terminals connected with the multiple fan-out traces; multiple test pads connected with the multiple electrode signal input terminals, each test pad has an end terminal; a signal transmitter and a signal receiver, wherein the signal transmitter transmits a signal at the starting terminal of one of the multiple electrode signal lines, and the signal receiver receives a signal from the end terminal of the one of the multiple electrode signal lines or the end terminal of one of the multiple test pads.

Wherein, the multiple electrode signal lines includes first electrode signal lines and second electrode signal lines located in the display region and arranged as a matrix; the multiple fan-out traces includes first fan-out traces and second fan-out traces, wherein, the first fan-out traces are connected with the first electrode signal lines and fanned out outwardly, and the second fan-out traces are connected with the second electrode signal lines and fanned out outwardly; the multiple electrode signal input terminals includes first electrode signal input terminals and second electrode signal input terminals, wherein, the first electrode signal input terminals are connected with the first fan-out traces, and the second electrode signal input terminals are connected with the second fan-out traces; the multiple test pads includes first test pads and/or second test pads, wherein, the first test pads are connected with the first electrode signal input terminals, and the second test pads are connected with the second electrode signal input terminals; wherein, the signal transmitter transmits a signal at the starting terminal of one of the first electrode signal lines and the second electrode signal lines, and the signal receiver receives a signal from the end terminal of the one of the first electrode signal lines and the second electrode signal lines, or the end terminal of one of the first test pads and he second test pads.

Wherein, each of the electrode signal lines is a bi-directional driving signal line connected with two connection lines, each connection line is connected with a corresponding one of the multiple test pads, and a distance between the two connection lines is not less than 7 μm.

Wherein, a length of each test pad is not less than 300 μm, a width of each test pad is not less than 30 μm, and a distance between two adjacent test pads is not less than 60 μm.

Wherein, the test pad and the electrode signal input terminal are connected through a connection line.

Wherein, the signal transmitter is an OST (Open or Short Test) machine signal transmitter, and the signal receiver an OST machine signal receiver.

Wherein, the signal transmitter is electrically connected with the starting terminal of one of the multiple electrode signal lines and moving along the starting terminals of the multiple electrode signal lines; the signal receiver is electrically connected with the end terminal of the one of the multiple electrode signal lines or the end terminal of one of the multiple test pads, and moving along the end terminals of the multiple electrode signal lines or the end terminals of the multiple test pads.

Correspondingly, another technology solution adopted by the present invention is: an inspection method for a display panel inspection system, the method used for inspecting a display panel, the display panel inspection system including: multiple electrode signal lines located in a display region of a display panel, each electrode signal line has a starting terminal and an end terminal; multiple fan-out traces connected with the multiple electrode signal lines and fanned out outwardly; multiple electrode signal input terminals connected with the multiple fan-out traces; multiple test pads connected with the multiple electrode signal input terminals, each test pad has an end terminal; and a signal transmitter and a signal receiver, and the method comprises following steps: step S1: the signal transmitter transmits a signal at the starting terminal of one of the multiple electrode signal lines, and the signal receiver receives a signal from the one of the multiple electrode signal lines or the end terminal of one of the multiple test pads; and step S2: determining that if the electrode signal lines and fan-out traces exist an open circuit phenomenon or a short circuit phenomenon according to the signal received by the signal receiver being a normal signal, an open circuit signal, or a short circuit signal.

Wherein, the step S2 specifically includes: if the signal received by the signal receiver at the end terminal of the one of the multiple electrode signal lines is the open circuit signal, determining that the multiple electrode signal lines exist the open circuit phenomenon, and if the signal received by the signal receiver at the end terminal of the one of the multiple electrode signal lines is the short circuit signal, determining that the multiple electrode signal lines exist the short circuit phenomenon; and if the signal received by the signal receiver at the end terminal of the one of the multiple test pads is the open circuit signal, determining that the fan-out traces exist the open circuit phenomenon, and if the signal received by the signal receiver at the end terminal of one of the multiple test pads is the short circuit signal, determining that the fan-out traces exist the short circuit phenomenon.

Correspondingly, another technology solution adopted by the present invention is: an inspection method for a display panel inspection system, the method used for inspecting a display panel, the display panel inspection system including: first electrode signal lines and second electrode signal lines located in the display region and arranged as a matrix; first fan-out traces and second fan-out traces, wherein, the first fan-out traces are connected with the first electrode signal lines and fanned out outwardly, and the second fan-out traces are connected with the second electrode signal lines and fanned out outwardly; first electrode signal input terminals and second electrode signal input terminals, wherein, the first electrode signal input terminals are connected with the first fan-out traces, and the second electrode signal input terminals are connected with the second fan-out traces; first test pads and/or second test pads, wherein, the first test pads are connected with the first electrode signal input terminals, and the second test pads are connected with the second electrode signal input terminals; and a signal transmitter and a signal receiver, and the method comprises following steps: step S1: wherein, the signal transmitter transmits a signal at the starting terminal of one of the first electrode signal lines or the second electrode signal lines, and the signal receiver receives a signal from the one of the first electrode signal lines or the second electrode signal lines, or the end terminal of one of the first test pads or the second test pads; and step S2: determining that if the first electrode signal lines or the second electrode signal lines, and the first fan-out traces or the second fan-out traces exist an open circuit phenomenon or a short circuit phenomenon according to the signal received by the signal receiver being a normal signal, an open circuit signal, or a short circuit signal.

Accordingly, the present invention can detect open or short circuit phenomenon of the electrode signal lines in the display region and the fan-out traces outside the display region in order to improve an undetectable problem of the open or short circuit phenomenon at the fan-out traces outside the display region to decrease a light line ratio in the module process to increase the product yield rate.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Figure 1:
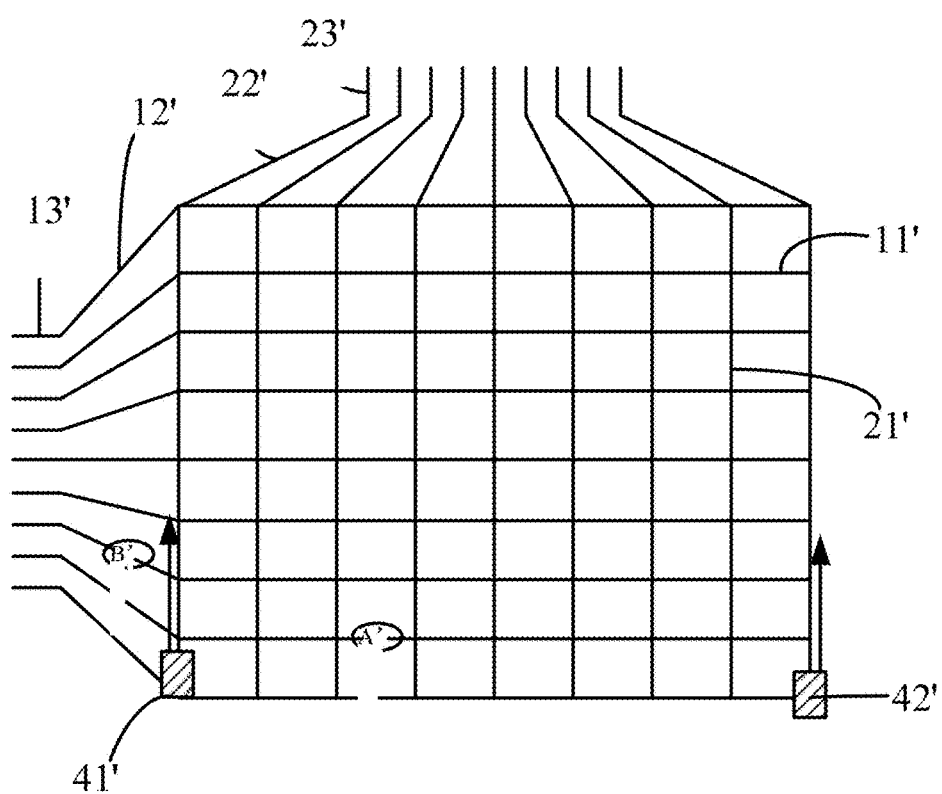
FIG. 1 is a schematic diagram of a display panel inspection system according to the conventional art.

With reference to FIG. 1, and FIG. 1 is a schematic diagram of a display panel inspection system according to the conventional art. The display panel includes a substrate (not shown in the figure) and multiple signal lines located on the substrate.

The following uses a large-sized TFT-LCD as an example for illustrating the present invention. A first electrode and a second electrode described in the following content are respectively a gate electrode and a source-drain electrode. In another embodiment, the first electrode and the second electrode are not limited to the gate electrode and the source-drain electrode.

The display panel inspection system specifically includes:

multiple electrode signal lines located in a display region, and each electrode signal line has a starting terminal and an end terminal. The electrode signal lines includes first electrode signal lines 11' and second electrode signal lines 21' arranged perpendicularly with each other. Wherein, each first electrode signal line 11' is a gate signal line. Each second electrode signal lines 21' is a source or drain signal line;

multiple fan-out traces connected with the electrode signal lines, and including first fan-out traces 12' connected with the first electrode signal lines 11' and fanned out outwardly, and second fan-out traces 22' connected with the second electrode signal lines 21' and fanned out outwardly;

multiple electrode signal input terminals connected with the fan-out traces, and the electrode signal input terminals includes first electrode signal input terminals 13' connected with the first fan-out traces 12', and second electrode signal input terminals 23' connected with the second fan-out traces 22'; and a signal transmitter 41' and a signal receiver 42', the signal transmitter 41' is located at the starting terminal of one of the first electrode signal lines 11' or the second electrode signal lines 21' to transmit a signal. The signal receiver 42' is located at the end terminal of the first electrode signal lines 11' or the second electrode signal lines 21' to receive a signal.

Figure 2A:
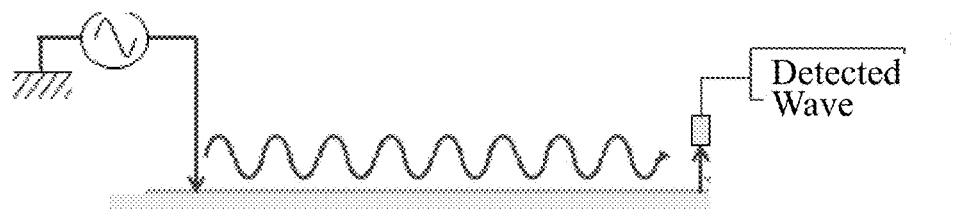
FIG. 2a is a schematic waveform diagram of a normal signal when an open and short circuit phenomenon is not existed in a signal line.
Figure 2B:
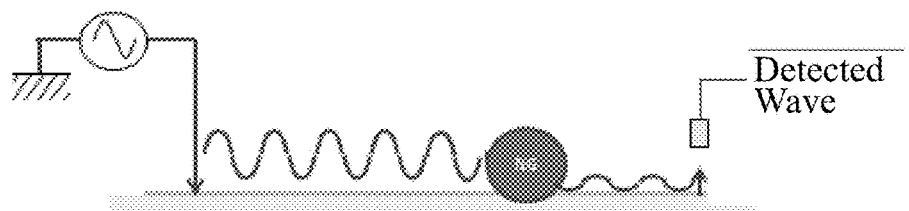
FIG. 2b is a schematic waveform diagram of a normal signal when an open and short circuit phenomenon is existed in a signal line.

FIG. 2a is a schematic waveform diagram of a normal signal when an open or short circuit phenomenon is not existed in a signal line. FIG. 2b is a schematic waveform diagram of a normal signal when an open or short circuit phenomenon is existed in a signal line. Accordingly, the signal transmitter 41' and the signal receiver 42' can detect that if there exists an open circuit phenomenon or a short circuit phenomenon between the signal transmitter 41' and the signal receiver 42'.

As shown in FIG. 1, when the signal transmitter 41' and the signal receiver 42' move along an indication direction as shown in FIG. 2, an open circuit phenomenon or a short circuit phenomenon at a portion A' on the first electrode signal line 11' in the display region can be detected. However, an open circuit or a short circuit phenomenon at a portion B' on the first fan-out traces 12' outside the display region cannot be detected.

In a display panel inspection system of the present invention, a display panel includes a substrate, and multiple signals located on the substrate, the display panel specifically includes:

multiple electrode signal lines located in a display region of a display panel, each electrode signal line has a starting terminal and an end terminal;

multiple fan-out traces connected with the multiple electrode signal lines and fanned out outwardly;

multiple electrode signal input terminals connected with the multiple fan-out traces;

multiple test pads connected with the multiple electrode signal input terminals, each test pad has an end terminal; and a signal transmitter and a signal receiver, wherein the signal transmitter transmits a signal at the starting terminal of one of the multiple electrode signal lines, and the signal receiver receives a signal from the end terminal of the one of the multiple electrode signal lines or the end terminal of one of the multiple test pads.

The starting terminal and the end terminal defined in the present invention use the fan-out traces as a reference, the terminals of the electrode signal line and the test pad closed to the fan-out traces are the starting terminals, away from the fan-out traces are end terminals.

Figure 3:
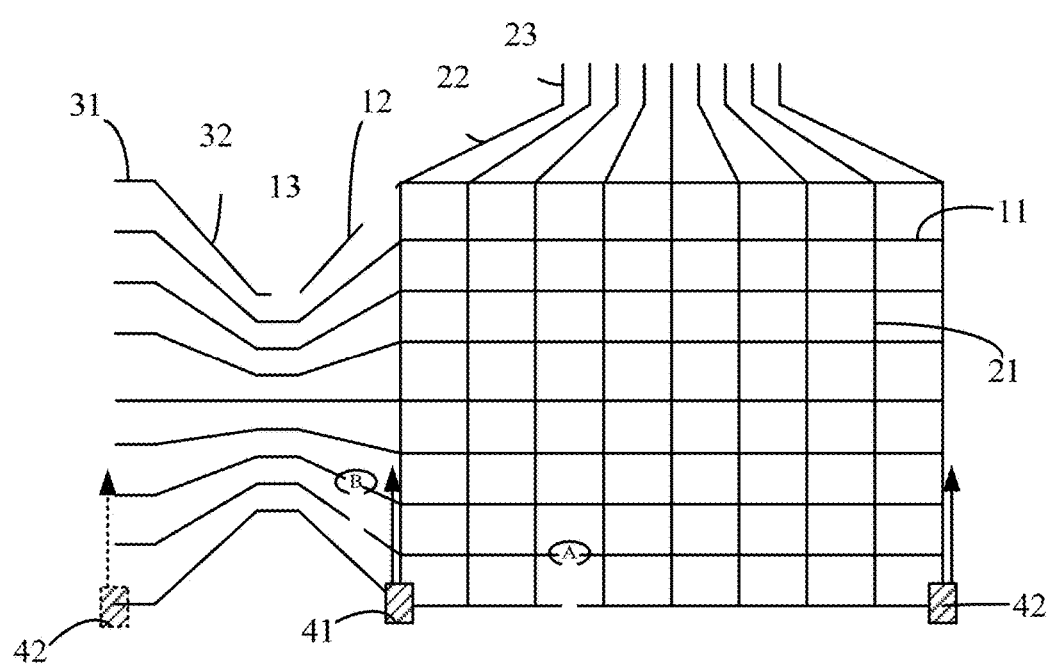
FIG. 3 is a schematic diagram of a display panel inspection system according to an embodiment of the present invention.

As shown in FIG. 3, a display panel inspection system according to an embodiment of the present invention specifically includes:

multiple electrode signal lines located in a display region, the electrode signal lines include multiple first electrode signal lines 11 and multiple second electrode signal lines 21 arranged perpendicularly with each other. In the present embodiment, each first electrode signal line 11 is a gate signal line. Each second electrode signal lines 21 is a source or drain signal line;

multiple fan-out traces connected with the electrode signal lines, and including first fan-out traces 12 connected with the first electrode signal lines 11 and fanned out outwardly, and second fan-out traces 22 connected with the second electrode signal lines 21 and fanned out outwardly;

multiple electrode signal input terminals connected with the fan-out traces, and the electrode signal input terminals include first electrode signal input terminals 13 connected with the first fan-out traces 12; and second electrode signal input terminals 23 connected with the second fan-out traces 23;

multiple first test pad 31 connected with the first electrode signal input terminal 13, wherein, the first test pads 31 are connected with the first electrode signal input terminals 13 through first connection lines 32;

a signal transmitter 41 and a signal receiver 42, wherein, the signal transmitter 41 transmits a signal at the starting terminal of the first electrode signal line 11, and the signal receiver 42 receives a signal at the end terminal of the first electrode signal line 11 and/or an end terminal of the test pad 31.

Furthermore, in another embodiment, multiple second test pads (not shown in the figure) can also be connected with the second electrode signal input terminals 23. In this case, the signal transmitter and the signal receiver are respectively located at a starting terminal of the second electrode signal and an end terminal of the second electrode signal or the second test pad. The operation principle is the same as above embodiment, no more repeating.

Figure 4:
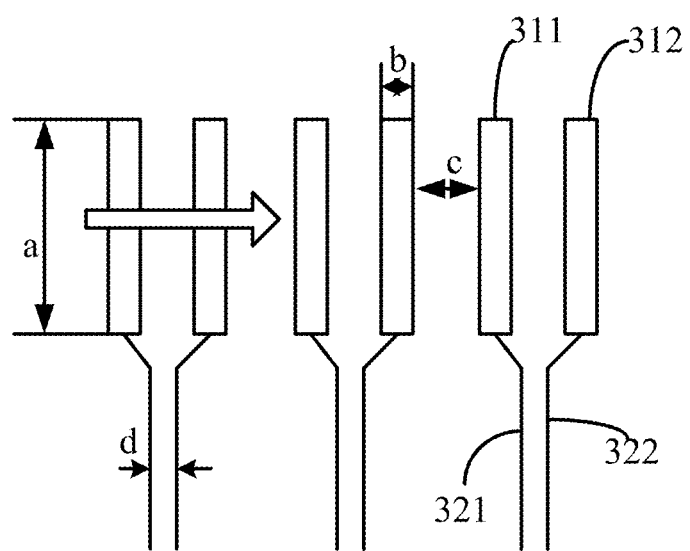
FIG. 4 is a partial schematic diagram of test pads and connection lines according to an embodiment of the present invention.

As shown in FIG. 3 and FIG. 4, in the present embodiment, each of the electrode signal lines is a bi-directional driving signal line, each electrode signal line is connected with the first test pads 311 and 312 through two connection lines 321 and 322. Besides, a distance d between the two connection lines 321 and 322 is not less than 7 µm. A length of each first test pads 311 and 312 is not less than 300 m. A width b of each first test pads 311 and 312 is not less than 30 µm. A distance c between two adjacent first test pads is not less than 60 µm. It should be noted that the above design data is also suitable for the second test pads. In the present embodiment, the signal transmitter 41 is an OST machine signal transmitter, and the signal receiver 42 is an OST machine signal receiver.

An OST machine is also known as an open or short test (Open/Short Test) device. The device is used for inspecting a waited for inspection trace between the signal transmitter 41 and the signal receiver 42 for detecting the existing of an open circuit phenomenon or a short circuit phenomenon. The operation principle is that two terminals of the substrate are respectively provides with a power providing side (equal to the signal transmitter 41 of the present invention) and a power receiving side (equal to the signal receiver 42 of the present invention). Through applying an alternating voltage (signal) on the power providing side to one terminal of the substrate, and through a substrate trace to deliver the alternating signal, a signal is detected at the power receiving side. Through amplifying and determining the signal received at the power receiving side, an open defect or a short defect is detected. When the signal received by the signal receiver is weak or even zero, the open circuit phenomenon is determined. When the signal received by the signal receiver is attenuated to about ½ (signal is divided), the short circuit phenomenon is determined.

It can be understood that the signal transmitter 41 and the signal receiver 42 can be other types of signal transmitter and signal receiver.

The signal transmitter 41 is electrically connected with a starting terminal of one of the electrode signal lines and moving along the starting terminals of the electrode signal lines. The signal receiver 42 is electrically connected with an end terminal of the one of the electrode signal lines or an end terminal of one of the test pads, and moving along the end terminals of the electrode signal lines or the end terminals of the test pads. When a signal received by the signal receiver at an end terminal of an electrode signal line is an open circuit signal or a short circuit signal, it shows that an open circuit phenomenon or a short circuit phenomenon is existed at a location of the electrode signal line (such as location A). When a signal received by the signal receiver at an end terminal of a test pad is an open circuit signal or a short circuit signal, it shows that an open phenomenon or a short circuit phenomenon is existed at a location of the fan-out trace (such as location B).

The inspection method for a display panel inspection system of the present invention includes:

step S1: the signal transmitter transmits a signal at the starting terminal of one of the multiple electrode signal lines, and the signal receiver receives a signal from the one of the multiple electrode signal lines or the end terminal of one of the multiple test pads; and step S2: determining that if the electrode signal lines and fan-out traces exist an open circuit phenomenon or a short circuit phenomenon according to the signal received by the signal receiver being a normal signal, an open circuit signal, or a short circuit signal.

If the signal received by the signal receiver at the end terminal of the one of the multiple electrode signal lines is the open circuit signal, determining that the multiple electrode signal lines exist the open circuit phenomenon, and if the signal received by the signal receiver at the end terminal of the one of the multiple electrode signal lines is the short circuit signal, determining that the multiple electrode signal lines exist the short circuit phenomenon.

If the signal received by the signal receiver at the end terminal of the one of the multiple test pads is the open circuit signal, determining that the fan-out traces exist the open circuit phenomenon, and if the signal received by the signal receiver at the end terminal of one of the multiple test pads is the short circuit signal, determining that the fan-out traces exist the short circuit phenomenon.

The inspection method according to an embodiment includes:

step S1: wherein, the signal transmitter transmits a signal at the starting terminal of one of the first electrode signal lines or the second electrode signal lines, and the signal receiver receives a signal from the one of the first electrode signal lines or the second electrode signal lines, or the end terminal of one of the first test pads or the second test pads; and step S2: determining that if the first electrode signal lines or the second electrode signal lines, and the first fan-out traces or the second fan-out traces exist an open circuit phenomenon or a short circuit phenomenon according to the signal received by the signal receiver being a normal signal, an open circuit signal, or a short circuit signal.

In another embodiment, the signal transmitter can transmit a signal at the end terminal of the first electrode line or the first test pad, and received a signal from the starting terminal of the first starting terminal, which can detect the open circuit phenomenon or a short circuit phenomenon on the first fan-out trace and the first electrode signal line similarly.

Similarly, the signal transmitter can transmit a signal at the starting terminal of the second electrode line or the second test pad, and received a signal from the end terminal of the first starting terminal or the second test pad, which can detect the open circuit phenomenon or a short circuit phenomenon on the second fan-out trace and the second electrode signal line.

In order to realize the detection of the fan-out traces, the present invention is required to dispose fan-out traces (such as first connection lines 32) at the periphery of the original detection trace and matched with the original detection trace, and test pads (such as the first test pads 31). The disposition of the connection lines and the test pads can be finished in the same process of the gate electrode line or the source/drain electrode line. Besides, the additional connection lines and the test pads are locate the periphery of the substrate of a final product so that can be cut off after inspection. Therefore, a width of a non-display region of a liquid crystal panel will not be increased or the manufacturing process will not be increased. That is, the final product and production process will not be affected.

Accordingly, the present invention can detect open or short circuit phenomenon of the electrode signal lines in the display region and the fan-out traces outside the display region in order to improve an undetectable problem of the open or short circuit phenomenon at the fan-out traces outside the display region to decrease a light line ratio in the module process to increase the product yield rate.

As stated above, for one person skilled in the art, other corresponding changes can be obtained according to technology solution and technology idea of the present invention. However, they are still covered by the claims in the present invention.

What is claimed is:

1. A display panel inspection system, comprising:
multiple electrode signal lines located in a display region of a display panel, each electrode signal line has a starting terminal and an end terminal;
multiple fan-out traces connected with the multiple electrode signal lines and fanned out outwardly;
multiple electrode signal input terminals connected with the multiple fan-out traces;
multiple test pads connected with the multiple electrode signal input terminals through multiple connection lines, wherein, each test pad has an end terminal;
a signal transmitter and a signal receiver, wherein the signal transmitter transmits a signal at the starting terminal of one of the multiple electrode signal lines, and the signal receiver receives the signal from the end terminal of the one of the multiple electrode signal lines and the end terminal of a corresponding one of the multiple test pads;
wherein, the multiple connection lines are fanned out outwardly such that a distance between adjacent connection lines is gradually increased; and
wherein, a width of each test pad is greater than a width of each connection line.

2. The display panel inspection system according to claim 1, wherein,
the multiple electrode signal lines includes first electrode signal lines and second electrode signal lines located in the display region and arranged as a matrix;
the multiple fan-out traces includes first fan-out traces and second fan-out traces, wherein, the first fan-out traces are connected with the first electrode signal lines and fanned out outwardly, and the second fan-out traces are connected with the second electrode signal lines and fanned out outwardly;
the multiple electrode signal input terminals includes first electrode signal input terminals and second electrode signal input terminals, wherein, the first electrode signal input terminals are connected with the first fan-out traces, and the second electrode signal input terminals are connected with the second fan-out traces;
the multiple test pads includes first test pads and/or second test pads, wherein, the first test pads are connected with the first electrode signal input terminals, and the second test pads are connected with the second electrode signal input terminals;
wherein, the signal transmitter transmits a signal at the starting terminals of the first electrode signal lines and the second electrode signal lines, and the signal receiver receives the signal from the end terminals of the first electrode signal lines and the second electrode signal lines, and the end terminals of the first test pads and the second test pads.

3. The display panel inspection system according to claim 1, wherein, each of the electrode signal lines is a bi-directional driving signal line, and is connected with two connection lines, each connection line is connected with a corresponding one of the multiple test pads, and a distance between the two connection lines is not less than 7 μm.

4. The display panel inspection system according to claim 1, wherein, a length of each test pad is not less than 300 μm, a width of each test pad is not less than 30 μm, and a distance between two adjacent test pads is not less than 60 μm.

5. The display panel inspection system according to claim 4, wherein, the test pad and the electrode signal input terminal are connected through a connection line.

6. The display panel inspection system according to claim 1, wherein, the signal transmitter is an OST (Open or Short Test) machine signal transmitter, and the signal receiver an OST machine signal receiver.

7. The display panel inspection system according to claim 1, wherein, the signal transmitter is electrically connected with the starting terminal of one of the multiple electrode signal lines and moving along the starting terminals of the multiple electrode signal lines; the signal receiver is electrically connected with the end terminal of the one of the multiple electrode signal lines or the end terminal of one of the multiple test pads, and moving along the end terminals of the multiple electrode signal lines or the end terminals of the multiple test pads.

* * * * *